(12) United States Patent
Zachreson et al.

(10) Patent No.: US 10,777,383 B2
(45) Date of Patent: Sep. 15, 2020

(54) METHOD FOR ALIGNMENT OF A LIGHT BEAM TO A CHARGED PARTICLE BEAM

(71) Applicant: FEI Company, Hillsboro, OR (US)

(72) Inventors: Cameron James Zachreson, Portland, OR (US); Dolf Timmerman, Amsterdam (NL); Milos Toth, Redfern (AU); Jorge Filevich, Portland, OR (US); Steven Randolph, Portland, OR (US); Aurelien Philippe Jean Maclou Botman, Portland, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/028,622

(22) Filed: Jul. 6, 2018

(65) Prior Publication Data
US 2019/0013178 A1    Jan. 10, 2019

Related U.S. Application Data

(60) Provisional application No. 62/530,829, filed on Jul. 10, 2017.

(51) Int. Cl.
| | |
|---|---|
| *H01J 37/28* | (2006.01) |
| *G02B 27/09* | (2006.01) |
| *G02B 26/10* | (2006.01) |
| *H01J 37/147* | (2006.01) |
| *H01J 37/26* | (2006.01) |
| *H01J 37/22* | (2006.01) |

(52) U.S. Cl.
CPC .............. *H01J 37/28* (2013.01); *G02B 26/10* (2013.01); *G02B 27/0916* (2013.01); *H01J 37/1471* (2013.01); *H01J 37/228* (2013.01); *H01J 37/265* (2013.01)

(58) Field of Classification Search
CPC ...... H01J 37/222; H01J 37/226; H01J 37/228; H01J 37/28
See application file for complete search history.

(56) References Cited

U.S. PATENT DOCUMENTS

| | | | |
|---|---|---|---|
| 6,855,622 B2 | 2/2005 | Le et al. | |
| 2011/0204228 A1* | 8/2011 | Tsuno | H01J 37/224 250/310 |

(Continued)

FOREIGN PATENT DOCUMENTS

DE    102009015341 A1    10/2010

OTHER PUBLICATIONS

Extended European Search Report received in European Patent Application No. EP18182609.0, dated Dec. 11, 2018, 7 pages.

*Primary Examiner* — Eliza W Osenbaugh-Stewart

(57) ABSTRACT

A method and system are disclosed for observing and aligning a beam of light in the sample chamber of a charged particle beam (CPB) system, such as an electron microscope or focused ion beam system. The method comprises providing an imaging aid inside the sample chamber with a calibration surface configured such that when illuminated by light, and simultaneously illuminated by a CPB, the intensity of the secondary radiation induced by the CPB is different in regions also illuminated by light relative to regions with lower light illumination levels, thereby providing an image of the light beam on the calibration surface. The image of the light beam may be used to align the light beam to the charged particle beam.

20 Claims, 12 Drawing Sheets

(56) References Cited

U.S. PATENT DOCUMENTS

2014/0070113 A1* 3/2014 Straw .................... H01J 37/226
　　　　　　　　　　　　　　　　　　　　　　250/453.11
2014/0131195 A1* 5/2014 Bruland ................ H01J 37/228
　　　　　　　　　　　　　　　　　　　　　　204/192.34

* cited by examiner

METHOD FOR ALIGNMENT OF A LIGHT BEAM TO A CHARGED PARTICLE BEAM

TECHNICAL FIELD

The present invention relates to charged particle beam systems, more specifically to a system and method for alignment of a light beam to a charged particle beam within a charged particle beam system.

BACKGROUND

Charged particle beam systems are used in a variety of applications, including the manufacturing, repair, and inspection of miniature devices, such as integrated circuits, magnetic recording heads, and photolithography masks. Examples of charged particle beam systems include focused ion beam (FIB) systems, which produce beams of focused ions, electron microscopes (SEMs, STEMs, and TEMs), which produce beams of electrons, and dual-beam systems, which include subsystems for generating both focused ion and electron beams.

Charged particle beam systems are frequently used in machining applications where it is desired to remove material from a workpiece with microscale and/or nanoscale precision. In the case of a FIB system, material removal can be carried out by a mechanism known as sputtering, in which highly energetic ions of the ion beam bombard the workpiece, causing particles to be locally ejected from the location on the workpiece surface impacted by the beam.

In some cases, it is desired to additionally expose a workpiece (also referred to as a "sample" or "specimen") to a beam of light inside the sample chamber of the charged particle beam system. For example, in some machining applications, laser ablation is used to remove material from the workpiece at rates higher than can be achieved using a focused ion beam. As another example, some applications use beams of focused or collimated light alone or in combination with a charged particle beam to trigger or alter the surface chemistry of the workpiece, such as in curing, etching, and deposition operations. U.S. Pat. Pub. No. 2014/0131195, which is assigned to the present Applicant and which is hereby incorporated by reference for all purposes, shows examples of systems that include a laser and a charged particle beam system.

In many applications, it is desired to expose the workpiece under vacuum conditions, thus the sample chamber of the charged particle beam system is typically also a vacuum chamber equipped with pumps for evacuating the chamber. However, the vacuum chamber presents a problem for operators when it is also desired to illuminate the sample with a light beam inside the sample chamber because the vacuum chamber obstructs the operator's field of view (FoV) of the light beam inside the chamber, making it difficult to align the light beam with the position on the sample selected for processing and/or analysis. Because of the operator's inability to visualize the position of the light beam inside the sample chamber, it is difficult to precisely align the beam spot with the sample position, and to precisely set the working distance for the focusing optics of the light beam implementation.

Thus, it would be beneficial to find methods for precisely aligning a light beam with a preselected analysis/processing position on a sample inside the vacuum chamber of a charged particle beam system. It would further be beneficial to provide systems and apparatuses capable of performing such methods.

SUMMARY

An object of the invention is to provide a method and apparatus for using a charged particle beam to observe the location where a beam of light is incident on a work piece, which observation can be used to align the light beam with the charged particle beam or with a feature on the work piece.

In some embodiments, a method and system are disclosed for observing and aligning a beam of light in the sample chamber of a charged particle beam (CPB) system, such as an electron microscope or focused ion beam system. The method comprises providing an imaging aid inside the sample chamber with a calibration surface configured such that when illuminated by light, and simultaneously illuminated by a CPB, the intensity of the secondary radiation induced by the CPB is increased in regions also illuminated by light relative to regions with lower light illumination levels, thereby providing an image (generated using the CPB) of the light beam on the calibration surface. The CPB image of the light beam may be used to align the light beam, for example, to the CPB or to a location on the sample. Typically, this alignment of the light beam to the CPB comprises centering the light beam on the center of a scan raster formed by X-Y deflection of the CPB to form an image, as is common for scanning electron microscopy. In this case, the center of the CPB scan raster may approximately correspond to the optical axis of the CPB column.

In some embodiments, a CPB system comprises a sample chamber with an imaging aid having a calibration surface disposed inside a sample chamber. A first subsystem is configured to generate, and illuminate the calibration surface with, a beam of light. A second subsystem is configured to generate, and irradiate the calibration surface with, a beam of charged particles. A detector is configured to measure the intensity of secondary radiation emitted from the calibration surface and to output an electronic signal that conveys the value of the intensity as a function of time. A computing device is configured to determine one or more characteristics of the light beam by analyzing the electronic signal. The calibration surface is configured such that simultaneously exposing an area of the calibration surface to the light beam and the CPB causes the area to emit the secondary radiation from the area at a first intensity, and exposing the area to the CPB while not exposing the area to the light beam causes the area to emit the secondary radiation at a second intensity different than the first intensity. For some embodiments, the first intensity is higher than the second intensity. For other embodiments the first intensity may be lower than the second intensity. In both situations, the difference between the first and second intensities may enable the position of the light beam within the CPB scan raster (which determines the size and position of the CPB image) to be observed.

In some embodiments, a non-transitory machine-readable storage medium comprises executable instructions for operating a CPB system, wherein the instructions, when executed, cause one or more processors to direct a subsystem configured to generate and direct a light beam to irradiate the location with a light beam during the interval; direct a CPB apparatus to induce emissions of secondary radiation from a location on a calibration surface of an imaging aid disposed within a sample chamber by simultaneously irradiating the calibration surface at the location with a CPB for an interval of time; direct a detector to measure the intensity of the secondary radiation during the interval, and to generate a signal that represents the value of the intensity over the interval as a function of time; and direct an analysis of the signal that determines a value of a property that characterizes a state of alignment of the first beam during the interval.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the scope of the invention as set forth in the appended claims.

BRIEF DESCRIPTION OF THE DRAWINGS

For a more thorough understanding of the present disclosure, and advantages thereof, reference is now made to the following descriptions taken in conjunction with the accompanying drawings, in which.

DETAILED DESCRIPTION

Definitions

Figure 1:
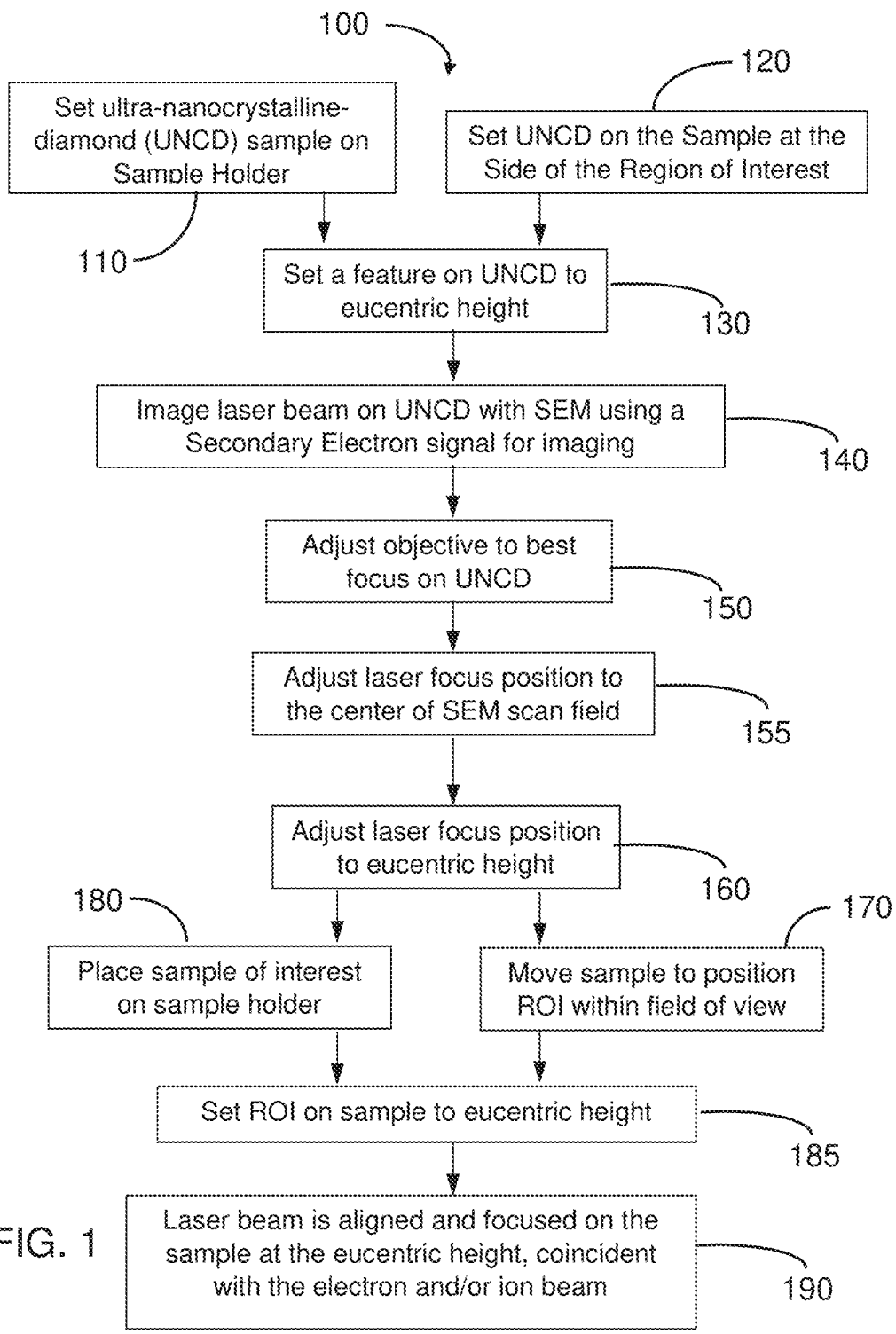
FIG. 1 is a flow diagram of a method for aligning and focusing a light beam inside a vacuum chamber of a CPB system according to an embodiment of the invention.

In the drawings and description that follow, like parts are typically marked throughout the specification and drawings with the same reference numerals, respectively. In addition, similar reference numerals may refer to similar components in different embodiments disclosed herein. The figures are not necessarily to scale. Certain features of the invention may be shown exaggerated in scale or in somewhat schematic form and some details of conventional elements may not be shown in the interest of clarity and conciseness. The present invention is susceptible to embodiments of different forms. Specific embodiments are described in detail and are shown in the drawings, with the understanding that the present disclosure is not intended to limit the invention to the embodiments illustrated and described herein. It is to be fully recognized that the different teachings of the embodiments discussed herein may be employed separately or in any suitable combination to produce desired results.

In the following discussion and in the claims, the terms "including" and "comprising" are used in an open-ended fashion, and thus should be interpreted to mean "including, but not limited to . . . ." To the extent that any term is not specially defined in this specification, the intent is that the term is to be given its plain and ordinary meaning. Furthermore, use of the term "and/or" herein shall be construed as an "inclusive" or, and not an "exclusive" or. For example, used herein the phrase "A and/or B" would mean "A, B, or A and B." As another example, used herein the phrase "A, B, and/or C" would mean "A, B, C, or any combination thereof." Further, whenever the terms "automatic," "automated," or similar terms are used herein, those terms will be understood to include manual initiation of the automatic or automated process or step.

The term "light beam subsystem" is used herein to refer to any apparatus and/or implementation of components that is capable of illuminating an object placed inside a sample chamber of a CPB system. The light beam can be focused, unfocused, and/or collimated. The source of the light beam could be, for example, a laser, an LED, or a UV lamp. The term "source" is used herein to refer to a source of charged particles and/or a source of focused or collimated light. The terms "multi-beam system," "CPB system", "charged particle beam system" (in cases where the presence of a light beam subsystem is indicated), and "combination laser and charged particle beam system" or "combination laser and CPB system" are used interchangeably to refer to a system configured to provide at least one type of CPB (e.g. a focused ion beam and/or an electron beam) and at least one type of light beam (e.g., a collimated or focused laser beam) to an interior of a sample chamber.

The term "sample" refers to an object to be irradiated and/or illuminated by a combination light and CPB system. In instances where "a target," "a specimen," "a substrate," or "a workpiece" is described as being disposed inside a combination light and CPB system, the target, specimen, substrate, or workpiece is a sample in the combination light and CPB system.

For some applications, it is desirable to direct both a CPB and a light beam to approximately the same location on a sample. In some systems, multiple CPBs, such as an electron beam and an ion beam may both be directed towards a sample, also into approximately the same location on the sample. Such systems include multiple-beam systems for fabrication of nanostructures and analytical tools such Raman spectroscopy instruments. In embodiments, an Imaging Aid (IA) is employed as a means for aligning the CPB with the laser beam. The location, shape and size of the intersection of the laser beam with the IA is detectable in the charged particle system, thereby enabling this intersection to be imaged.

As used herein, an 'alignment property' is any characteristic of the portion of the light beam inside the sample chamber that may be useful in adjusting the alignment of the light beam inside the sample chamber to a desired state. Examples of suitable alignment properties include, but are not limited to, intensity, orientation, focus, shape (e.g., cross-sectional profile, axial profile, etc.), dimensions (e.g., diameter, length, etc.), spot size, spot profile, and/or spot position. In addition, the expressions "determination of an alignment property" and "determination of a value of an alignment property" can refer to: a numerical calculation carried out by a computer, a mathematical or qualitative assessment performed as a mental step by a human operator upon observing image data generated from a simultaneously irradiated region of the IA; or a combination thereof.

As used herein, the "shape" of the light beam at a surface includes the state of focus and the diffraction pattern of the light beam at the surface.

Flow Diagram of an Embodiment

FIG. 1 is a flow diagram of method 100 for aligning and focusing a light beam at a sample position inside a vacuum chamber of a CPB system according to an embodiment of the present disclosure. The light beam typically enters the vacuum chamber through a tube that is part of the laser optics. In some embodiments, the alignment comprises changing the pointing of the laser beam so it goes into the vacuum chamber through the tube, parallel to the tube axis, and simultaneously setting the position of the tube such that the laser beam is focused at eucentric height, coincident with the e-beam and/or ion beam. Keeping the beam centered in the tub and parallel to the tube axis ensures that the beam goes through the center of the optics, which minimizes aberration. The eucentric height is determined independently from the light position, and involves the working distance and the center of stage rotation. Alignments are typically done relative to this position.

Method 100 may begin at either block 110 or block 120. In block 110, an IA comprising an ultra-nano-crystalline diamond (UNCD) sample is attached directly to the sample holder, but the sample of interest is not yet loaded onto the sample holder. Alternatively, in block 120, the UNCD sample is set on the side of a sample of interest or deposited onto a region of the sample neighboring the region of interest, so that the UNCD sample and the sample of interest are both loaded at the same time on the sample holder.

In block 130 the sample stage, for example sample stage 210 (see FIGS. 2 and 3), is moved vertically to set a feature on the UNCD to the eucentric height.

Next, in block 140 the UNCD sample is imaged using an SEM simultaneously with the laser beam being directed onto the UNCD sample. The e-beam of the SEM illuminates the UNCD sample with a focused primary electron beam. Due to the impact of the primary electron beam, secondary emissions, such as secondary electrons (SEs) and/or backscattered electrons (BSEs), are emitted and collected with one or more detectors, while the primary beam is scanned across the sample, for example in a raster pattern. Due to the interaction between the laser light illuminating the UNCD sample and the electron beam scanning across the UNCD sample, an image (see FIG. 4 for example) of the laser beam spot at the UNCD sample is obtained.

In block 150 laser optics, for example laser optics 212 (see FIG. 2), are adjusted to produce a best focus by adjusting the focus along the axis of the light beam with respect to the UNCD sample. This procedure utilizes the real-time image of the laser spot to enable the laser optics to be adjusted to produce the smallest (and brightest) central spot, for example central spot 402 (see FIG. 4), which may be the best focus, on the UNCD sample. Note that in block 150, the UNCD sample (and the sample of interest) may not yet be at the eucentric height.

In block 155 the laser optics are adjusted to position the laser focus position at the center of the scan field of the SEM. The laser is aligned in the X-Y plane of the UNCD sample to ensure alignment of the laser to the CPB. Note that because the UNCD sample is tilted or has a surface at a non-normal angle to the CPB (see sample 208 in FIG. 2 for example), the X-Y plane of the sample (which is approximately perpendicular to the axis of light beam) is also tilted relative to the X-Y plane of the sample stage which is horizontal. This alignment procedure ensures that the laser beam goes through the laser optics on-axis and parallel to the axis of the laser optics, and is focused at the sample at the eucentric height, coincident with the CPB(s).

Alignment continues in block 160, in which the UNCD sample (and the sample of interest if method 100 started at block 120), is moved vertically to the eucentric height by the stage, and the laser focus is adjusted accordingly by the laser optics to position the laser focus at the eucentric height.

Either block 170 or block 180 is now entered after exiting block 160. Block 180 is entered out of block 160 if method 100 started from block 110, where only the UNCD sample was initially loaded onto the sample holder (i.e., without the sample of interest). Thus, in block 180, the UNCD sample is removed and the sample of interest is then loaded into the sample holder. Block 170 is entered out of block 160 if method 100 started from block 120, and both the UNCD sample and the sample of interest were loaded initially onto the sample holder. Thus, in this case, it is only necessary to use sample stage 210 to move the sample of interest (containing the region of interest, ROI) into the FoV of the SEM.

Next, in block 185 the sample stage 210 moves vertically to position the sample of interest (with the ROI) to the eucentric height.

Figure 2:
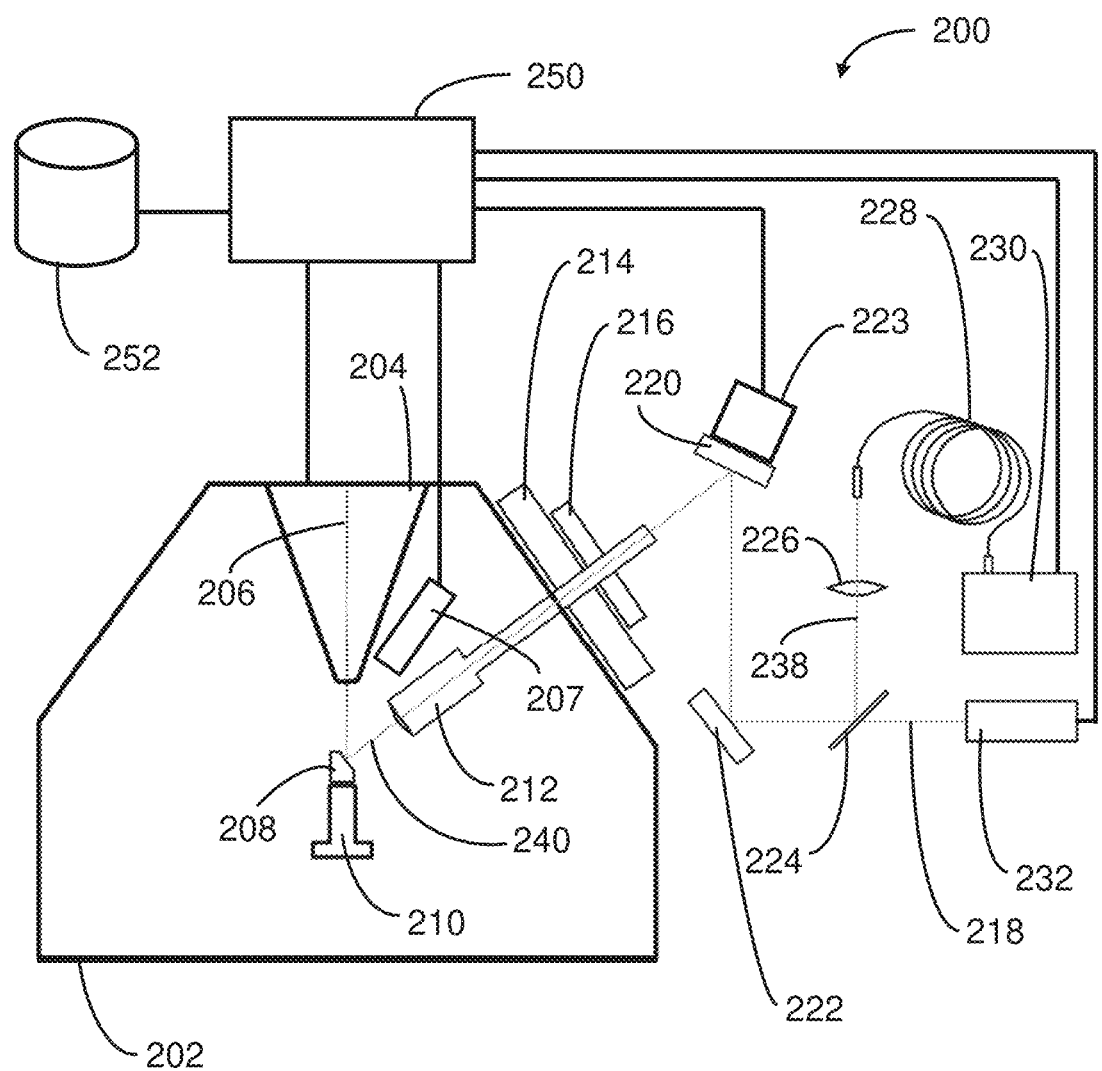
FIG. 2 shows a combination light and CPB system according to an embodiment.
Figure 3:
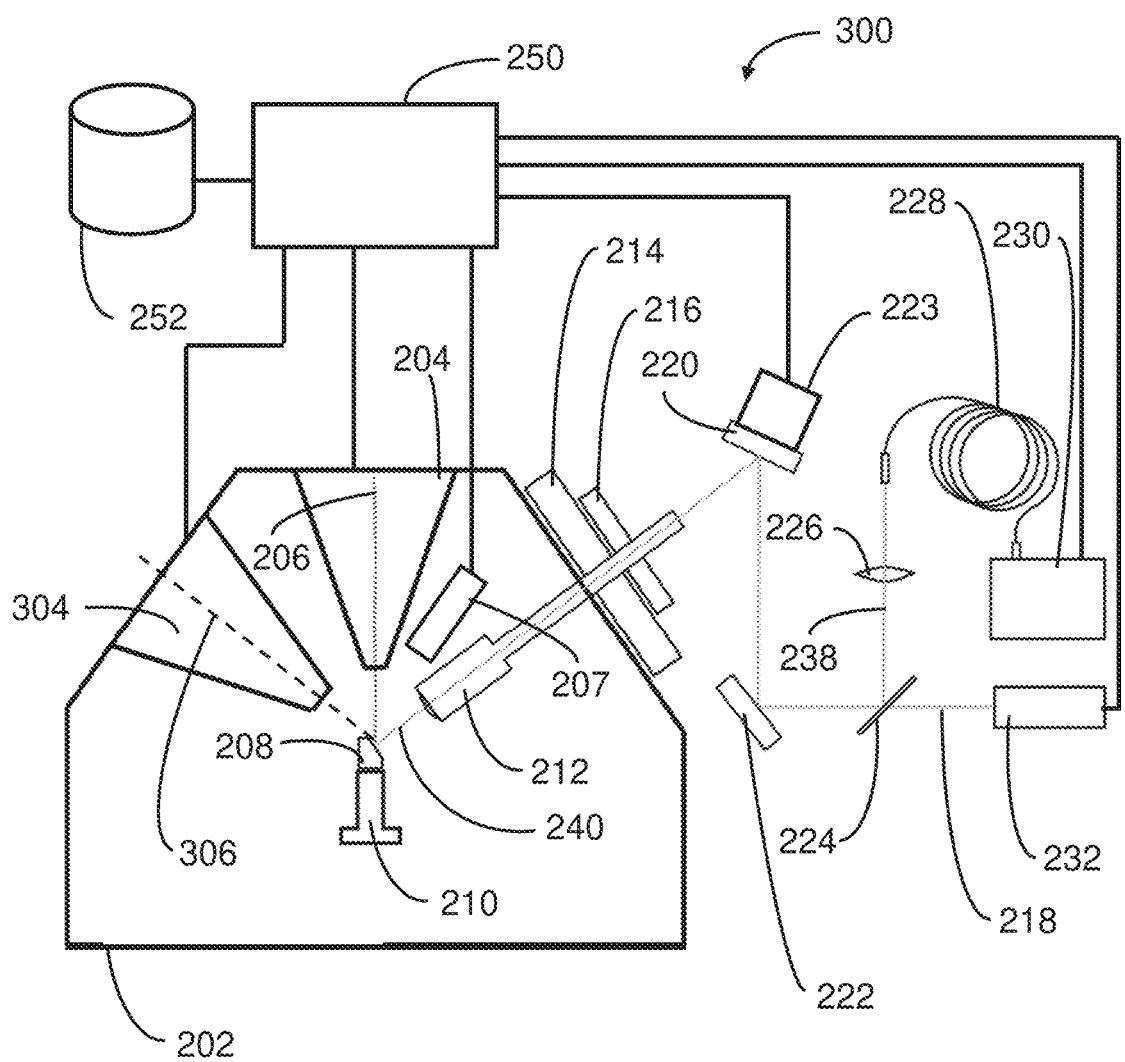
FIG. 3 shows a combination light and CPB system according to an embodiment.

Method 100 is completed at block 190, in which the laser beam is aligned and focused on the sample of interest at the eucentric height, coincident with the electron beam and/or ion beam from respective CPB columns, such as columns 204 and 304 (see FIG. 2 or 3 for example). While method 100 describes aligning the laser with the electron beam at a eucentric position, method 100 is not limited to aligning at the eucentric position and eucentric height, nor is the method limited to a focused laser.

In some embodiment, adjusting the position of the light beam can entail moving a center of the first beam spot, in the x, y, and/or z direction, a distance of less than or equal to 100 nm, less than or equal to 1 μm, less than or equal to 10 μm, of less than or equal to 100 μm, of less than or equal to 1 mm System Diagram of an Embodiment FIG. 2 shows 200 a combination light and CPB system according to an embodiment of the present disclosure. The method 100 may be implemented on the system 200 to align a light beam with one or more CPBs, for example, using an IA. Although light can pass through both air and vacuum, in general, charged particles cannot pass through air due to scattering, thus a vacuum chamber 202 is configured to contain the sample 208, CPB column 204 (generating CPB 206), and laser optics 212. The vacuum chamber 202 is typically configured with a roughing pump (not shown) for removal of most of the air in chamber 202, and then a high-vacuum pump (not shown) such as a turbomolecular pump to remove nearly all the remaining air to produce at least a high vacuum inside chamber 202. An IA, such as an UNCD, and a sample of interest are mounted on a sample stage 210. The sample stage 210 enables motion along various linear axes and/or around different axes of rotation to facilitate positioning the sample 208 (either the IA and/or the sample of interest) under both the CPB 206 and light beam 240.

Laser optics 212 extends through the wall of vacuum chamber 202 typically with a flexible air-tight bellows or equivalent. Precise positioning in multiple linear and angular axes is enabled by mounting structure comprising X-Y motion stage 214 and Z-motion stage 216. Various configurations for the mounting structure fall within the scope of the invention. The Z-axis of Z-motion stage 216 is oriented along the axis of laser optics 212, thus motion along the Z-axis enables focusing of the laser beam onto the surface of sample 208, which may be tilted as shown. Motion along the X-Y-axes of motion stage 214 enables the laser beam to be positioned relative to the CPB column scan raster (e.g., the axis as defined by CPB 206). The tilt of the laser optics is determined by the construction of the flange on the vacuum chamber 202. In some embodiments, tilt stages may be employed (working in conjunction with X-Y-Z motion stages).

Laser 232 generates a laser beam 218 that partially passes through dichroic mirror 224. While the herein disclosed process has been shown to work at wavelengths between about 500 nm and about 800 nm, it is likely that visible and/or UV wavelengths below 500 nm would work. In one embodiment, a laser beam having a wavelength of 532 nm was used.] Light reflected off mirror 224 is directed downwards in FIG. 2 (not shown). Relay mirror 222 reflects the laser light to the scanning mirror 220 which is mounted on actuator 223 enabling the laser beam to be changed in position and direction entering laser optics 212, thereby changing the location of the laser beam at the UNCD sample and the sample of interest. Light from the sample 208 passes back through the laser optics 212, is reflected off scanning mirror 220, and then relay mirror 222. Part of this light is also reflected off dichroic mirror 224 and up through lens 226 which focuses the light 238 into the entrance of optical fiber 228 which leads to spectrometer 230. Spectrometer 230 may separate the incoming light from optical fiber 228 into component frequencies (wavelengths) in order to perform various types of optical spectroscopy. Alignment of laser beam 240 on the sample 208 requires an iterative alignment of mirrors 222, 220, and laser optics 212 (using motion stages 214 and 216). A system for positioning a laser beam within a CPB vacuum chamber is shown, for example, in U.S. Pat. No. 8,766,213 to Straw et al for "Automated Method for Coincident Alignment of a Laser Beam and a Charged Particle Beam," which is hereby incorporated by reference for all purposes. While the laser and the associated optics are shown outside of the vacuum chamber 202, in some embodiments, the laser can be positioned within the vacuum chamber 202, and any physical location of the laser with respect to the vacuum chamber is within the scope of the present disclosure and contemplated herein Detector 207 may detect secondary electrons (SEs), backscattered electrons (BSEs), or both SEs and BSEs that may be emitted by the sample 208. The detection of the SEs and/or the BSEs allow imaging of the sample 208, such as a surface of the sample, and may be generated in response to the CPB 206.

One or more processors 250 are connected to the various components of the system 200 or 300, such as the column 204, detector 207, laser 232, actuator 223, spectrometer 230, as well as motorized stages, etc. A non-transitory machine-readable storage medium 252 may include executable instructions for the CPB system 200. These executable instructions, when executed, cause the one or more processors 250 to control various aspects of system operation, such as the generation of CPB 206, operation of laser 232, tilting of scanning mirror 220, and control of spectrometer 230, etc. In various embodiments, non-transitory machine-readable storage medium 252 includes executable instructions for carrying out one or more of the methods disclosed herein, such as methods 100, 500, and/or 1200. In such embodiments, the executable instructions, when executed by the one or more processors 250, coordinate and direct components of system 200 to perform the steps of the method.

System of Diagram of an Embodiment

FIG. 3 shows an example system 300, which is a combination of a light system and a charged particle beam system. System 300 is similar to system 200 (FIG. 2) but with an additional charged particle optical column 304 generating a second CPB 306. Elements in FIG. 3 that are the same as those in FIG. 2 are referred to by the same reference numbers. Typically, if CPB 206 is an electron beam, then CPB 306 will be an ion beam 306. Systems with two columns generating two different charged particle beams are typically called "dual-beam systems."

The alignment methods disclosed herein may be used to align CPB 206 and laser beam 240, and/or CPB 306 and laser beam 240. Typically, in a dual-beam system, alignment between the two CPBs may be accomplished by performing a FIB milling operation, then imaging the outcome of the milling operation with the SEM. However, it is also possible to align beams 206 and 240 and then beams 306 and 240, with the result that now beams 206 and 306 are also aligned to each other. This indirect alignment method may be useful for samples for which FIB milling is either impossible or not advisable.

SEM Image for an Embodiment

Figure 4:
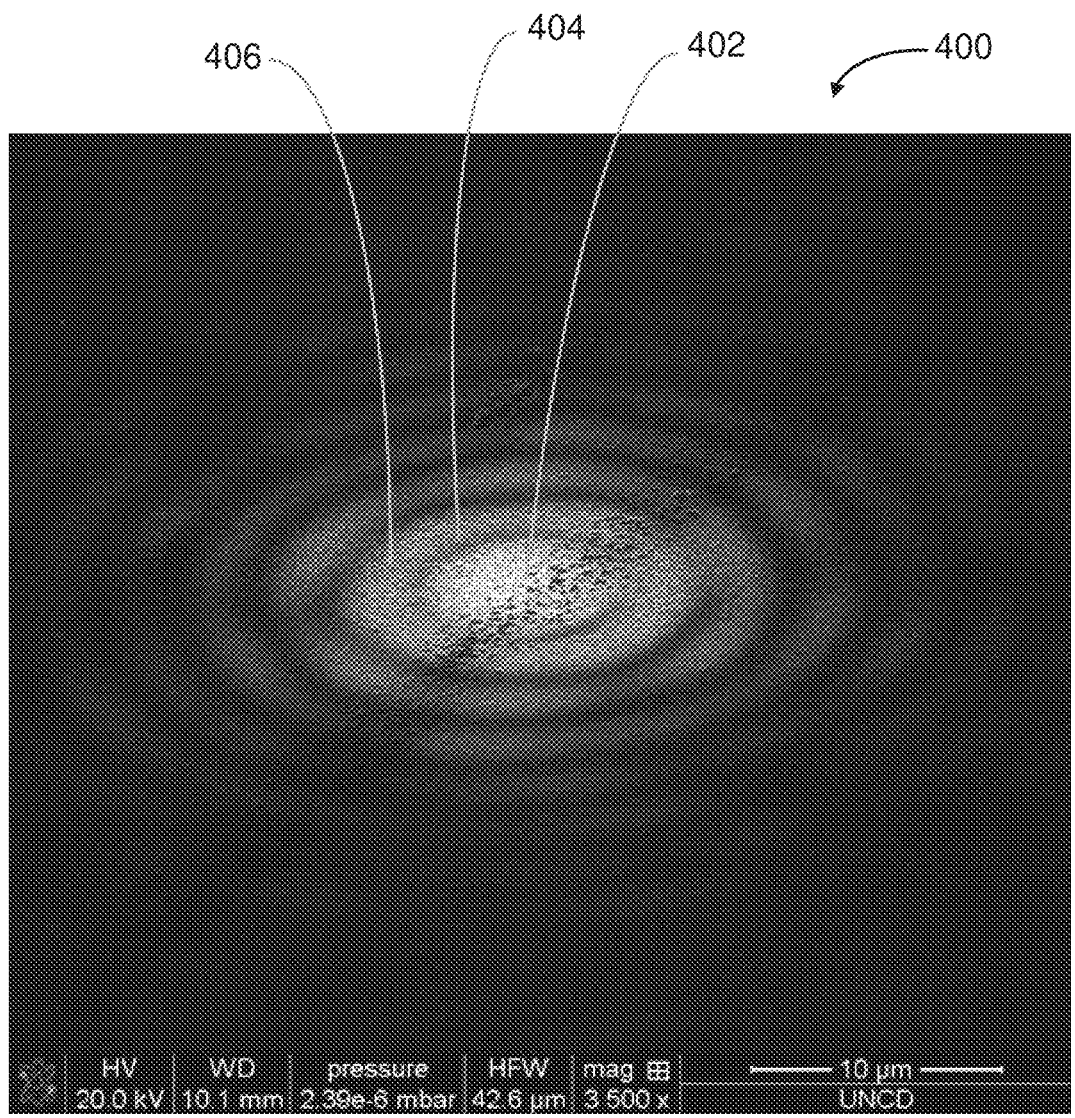
FIG. 4 shows an SEM image of an imaging aid comprising ultra-nano-crystalline diamond (UNCD) being illuminated with a laser beam, in accordance with an embodiment.

FIG. 4 shows an SEM image 400 of an IA comprising a UNCD being illuminated simultaneously by a laser beam and CPB in accordance with an embodiment disclosed herein. The contrast mechanism which produces the light center region 402 and the light first ring 406, as well as the other concentric light rings surrounding ring 406, is enhancement of the SE emission induced by the arrival of photons of the laser beam on the same surface of the UNCD as the CPB 206 is arriving. In this context, "contrast" is the ratio of the signal from the area being illuminated by photons to the signal from surrounding areas not illuminated by photons. While not wishing to be bound by theory, the effect of laser-enhancement of SE emission is believed to arise due to the laser illumination locally modifying the charging characteristics of the UNCD. Other materials which also demonstrate this SE emission enhancement effect include aluminum oxide and anodized aluminum, magnesium oxide, nickel oxide, copper oxide, or wherein the IA comprises a layer of a first material, the layer providing a calibration surface. The calibration surface represents the "active layer" of the IA. The layer is "active" in the sense that it enhances secondary emission upon impact of a charge particle beam in the presence of the light beam. An active layer, may include, for example, UNCD, semiconductor in which laser diodes are fabricated, or other material that enhances secondary emission in the presence of illuminating light. SE emission enhancement in these materials lasts for a few seconds. UNCD materials appear to be unique in having much shorter enhancement times which is preferred in order to reduce or eliminate "lag" in the SEM image using SE emission and detection. Longer lag times may result in "blurring" of the image if any parameters are changed, such as the laser position, the laser focus, the sample height or position, etc., making operation as an alignment aid slower. UNCD materials also demonstrate a much larger SE emission enhancement effect than other materials. An additional benefit of the use of UNCD materials is that the enhancement of SE emission appears to depend on the intensity of the laser beam—this may be seen in FIG. 4 which is a gray-scale image, where the central spot 402 is brighter than the ring 406, which is known to have lower light intensity from Airy disk theory. FIG. 4 was generated using 532 nm laser light which was limited by a small circular aperture to produce the Airy disk shown. Streaks in the image are due to scratches on the surface of the UNCD sample. The SE emission enhancement effect was experimentally observed using both an SEM and a focused ion beam. The UNCD sample is typically a thin small film which may either be loaded onto the sample holder in the absence of the sample of interest (e.g., as in block 110) or next to the sample of interest (e.g., as in block 120).

Flow Diagram of an Embodiment

Figure 5:
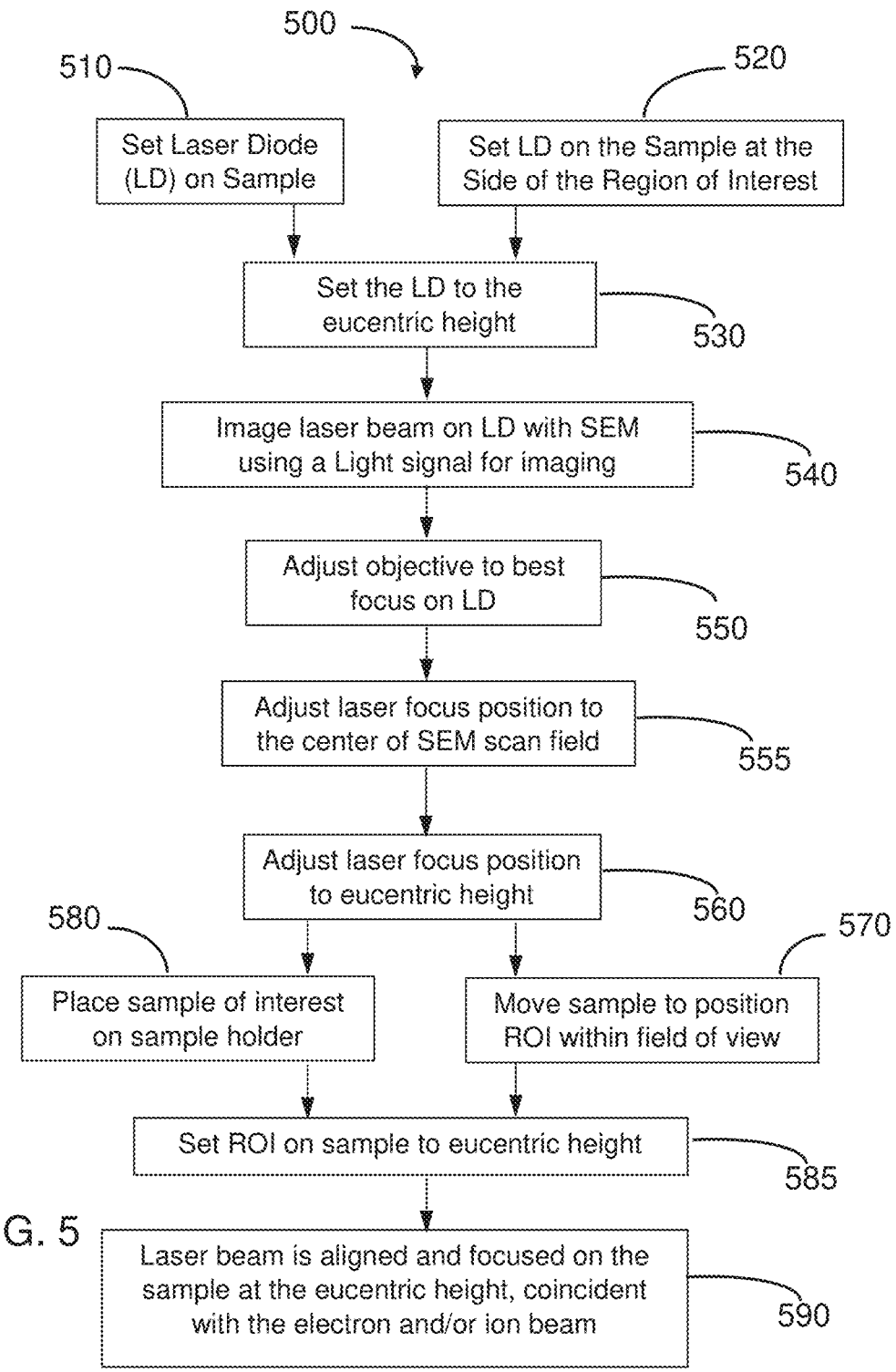
FIG. 5 is a flow diagram of a method for aligning and focusing a light beam inside a vacuum chamber of a CPB system according to an embodiment.

FIG. 5 is a flow diagram of method 500 for aligning and focusing a light beam at a eucentric sample position inside a vacuum chamber of a CPB system according to an embodiment of the present disclosure. The method 500 may be implemented, for example, by the system 200 and/or 300.

Method 500 may begin at either block 510 or block 520. In block 510, a laser diode (LD) is attached directly to the sample holder, and the sample of interest is not yet loaded into the sample holder. Alternatively, in block 520, the LD is set on the side of a sample of interest, so that the LD and the sample of interest are both loaded at the same time on the sample holder.

In block 530 the sample stage, such as sample stage 610 (see FIG. 6), is moved vertically to set the LD to the eucentric height.

Figure 9:
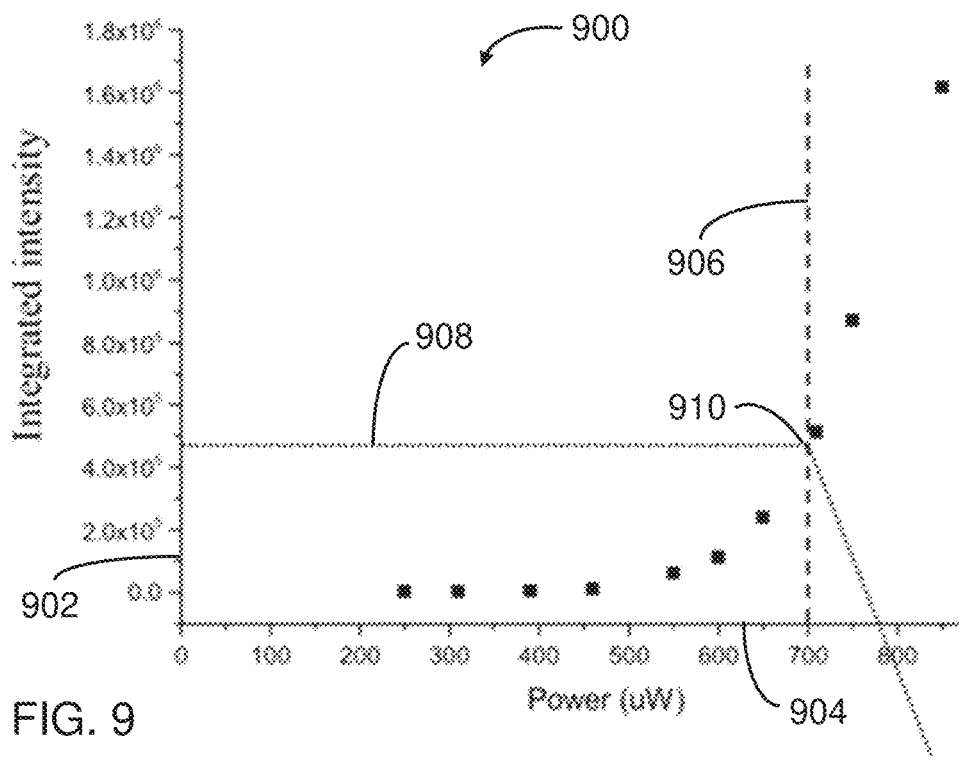
FIG. 9 is a graph of the integrated intensity of light emissions from a laser diode during illumination with a laser, the integrated intensity plotted as a function of the power of the illuminating laser.
Figure 10:
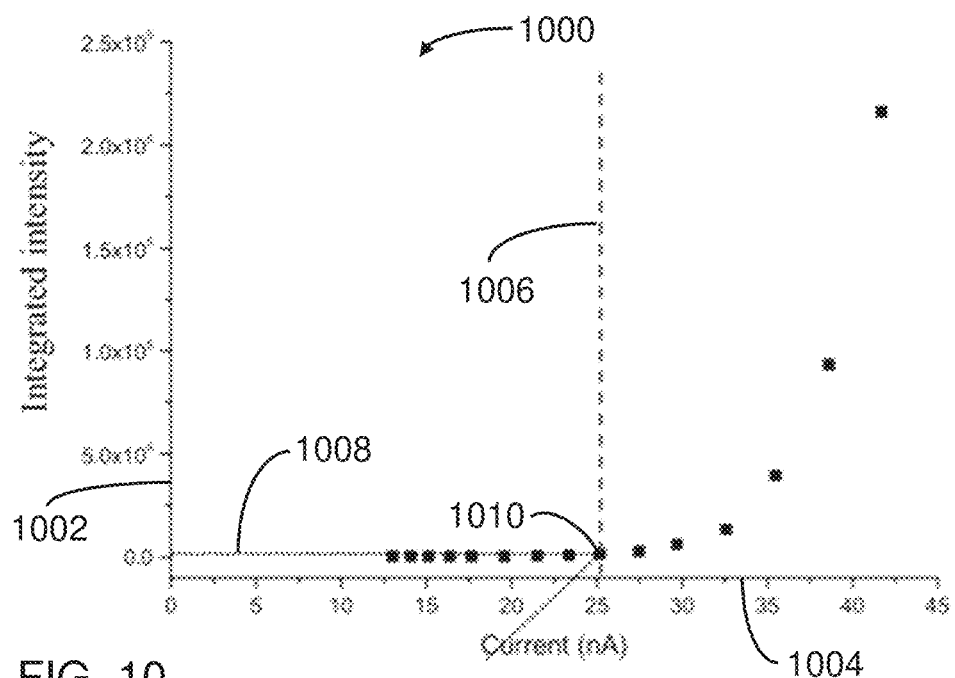
FIG. 10 is a graph of the integrated intensity of light emissions from the laser diode of FIG. 9 while irradiated with an electron beam in the absence of the laser beam, the integrated intensity plotted as a function of the current of the electron beam.
Figure 11:
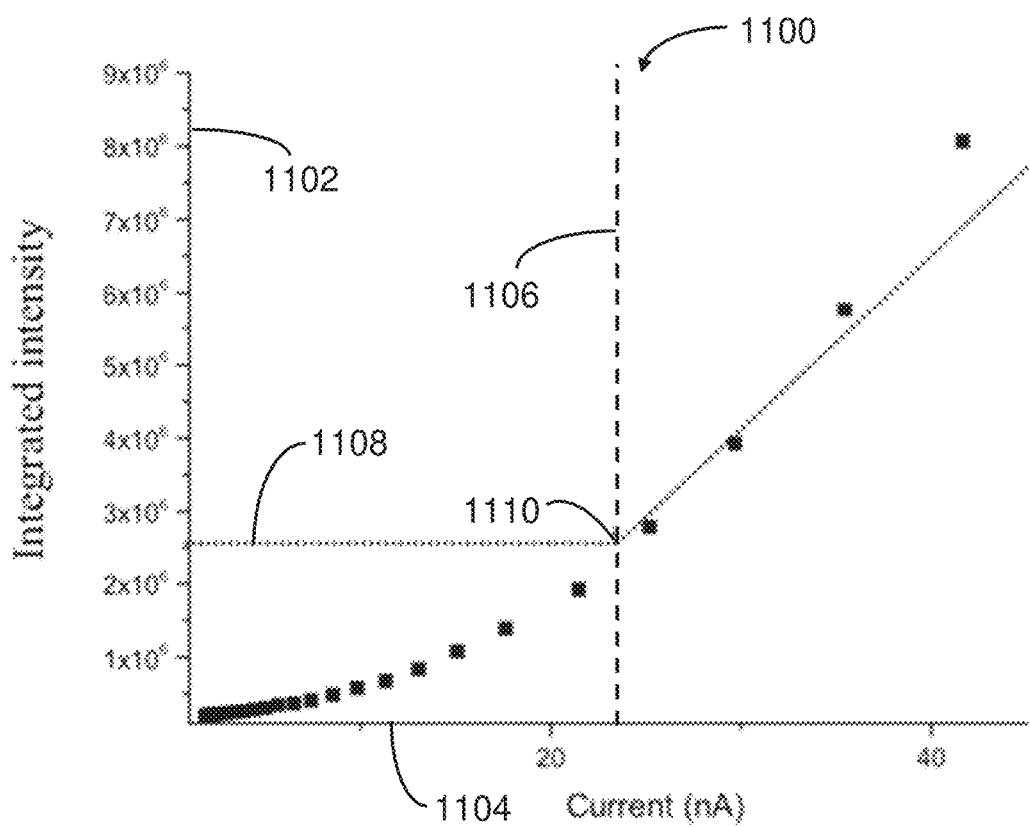
FIG. 11 is a graph of experimental data showing the integrated intensity of light emissions from the CPB system of FIG. 6.

In block 540 the LD is imaged using the SEM simultaneously with the laser beam being directed onto the LD. The SEM illuminates the LD with a focused primary electron beam. Due to the impact of the primary electron beam, cathodoluminescence and/or photoluminescence may be induced in the LD, causing emission of light which is detected as described in FIG. 6. Due to the interaction between the laser light illuminating the LD and the electron beam scanning across the LD, an image (see FIG. 7) of the laser beam spot on the LD is obtained. FIGS. 9-11 show graphs explaining the origin of the imaging contrast.

Next, in block 550 the laser optics are adjusted to produce a best focus by adjusting the focus height vertically with respect to the LD. This procedure utilizes the real-time image of the laser spot as in FIG. 7 to enable the laser optics to be adjusted to produce the smallest (and brightest) central spot 702. Note that in block 550, the LD (and the sample of interest) may not yet be at the eucentric height.

In block 555 the laser optics are adjusted to position the laser focus position at the center of the scan field of the SEM. The laser is aligned in the horizontal X-Y plane of the sample to ensure alignment of the laser to the CPB. This alignment procedure ensures that the laser beam goes through the laser optics on-axis, and parallel to the axis, of the laser optics and is focused at the sample at the eucentric height, coincident with the CPB.

Alignment in X-Y continues in block 560, where the LD (and the sample of interest if method 500 started at block 520), are moved vertically to the eucentric height, and the laser focus is adjusted accordingly by the laser optics to position the laser focus at the eucentric height.

Either block 570 or block 580 is now entered after exiting block 560. Block 580 is entered out of block 560 if method 500 started from block 510, where only the LD was initially loaded onto the sample holder (i.e., without the sample of interest). Thus, in block 580, the LD is removed, and the sample of interest is then loaded into the sample holder. Block 570 is entered out of block 560 if method 500 started from block 520, and both the LD and the sample of interest were loaded initially into the sample holder. Thus, in this case, it is only necessary to use sample stage 610 to move the sample of interest (containing the region of interest, ROI) into the FoV of the SEM.

Now block 585 is entered, in which the sample stage 610 is moved vertically to position the sample of interest (with the ROI) to the eucentric height.

Method 500 is completed at block 590, in which the Laser beam is aligned and focused on the sample of interest at the eucentric height, coincident with the electron beam and/or ion beam 606 from CPB column 604.

System Diagram of an Embodiment

Figure 6:
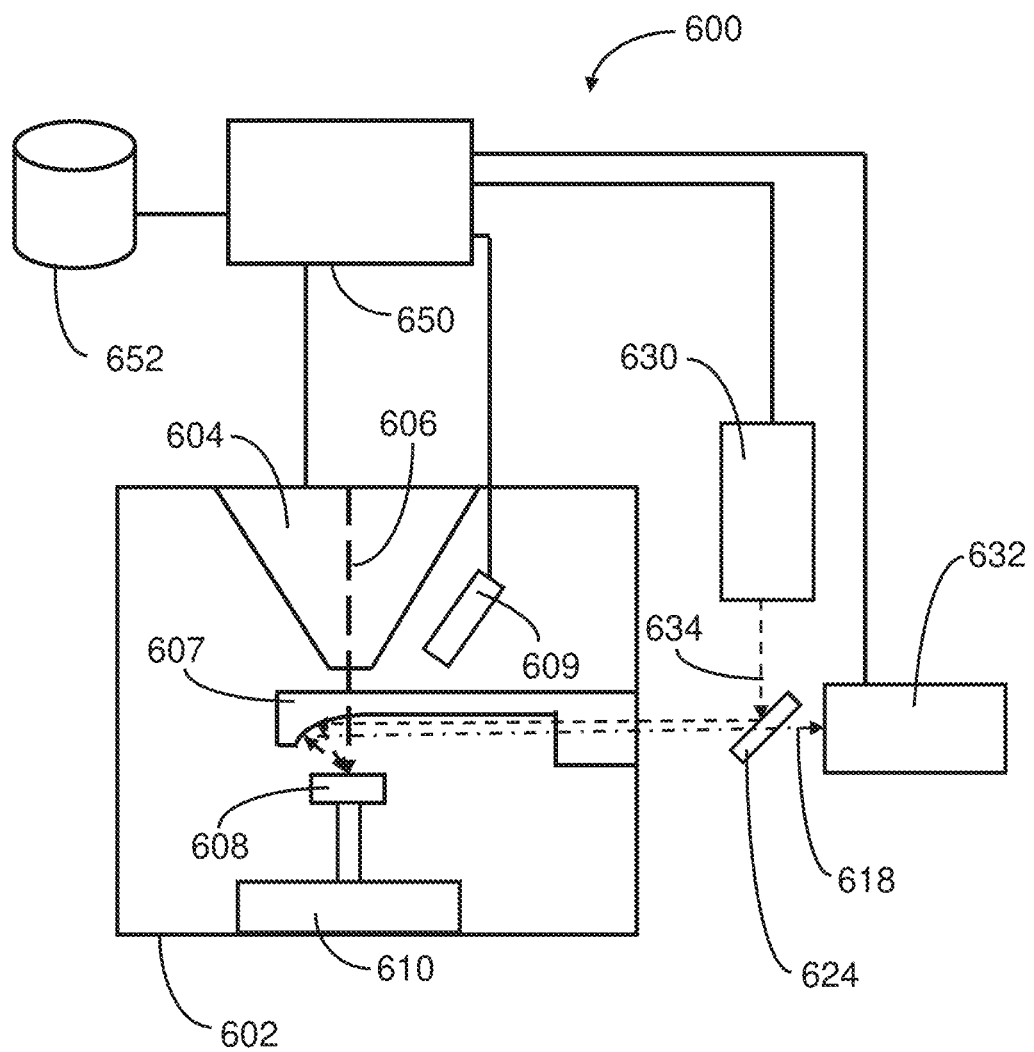
FIG. 6 shows a simplified schematic of a combination light and CPB system according to an embodiment.

FIG. 6 shows a simplified schematic of a combination light and CPB system 600 according to an embodiment of the present disclosure. Although light can pass through both air and vacuum, in general, charged particles cannot pass through air due to scattering, thus a vacuum chamber 602 is configured to contain the sample 608, charged particle column 604 (generating CPB 606), and laser optics 607. The same pumping considerations apply as for chamber 202 in FIG. 2. The LD sample (see FIG. 7) and sample of interest are mounted on a sample stage 610 which enables motion in along various linear axes and/or around different axes of rotation to facilitate positioning the sample 608 under both the CPB 606 and laser beam 634. Detector 609 may detect SEs, BSEs, or both.

The laser optics 607 is shown extending inwards from the wall of chamber 602, where a viewport would be located to permit inward passage of laser beam 634 from laser 630, and outward passage of light 618 from the LD or the sample of interest. Light 618 passes though dichroic mirror 624 and is collected by detector 632, while light 634 from laser 630 is partially reflected off dichroic mirror 624 to pass towards the left of FIG. 6 and into chamber 602 as shown. Laser optics 607 comprises a parabolic focusing mirror located between column 604 and sample 608—a small hole is located (not shown) in optics 607 to permit passage of CPB 606 from column 604 to sample 608. The focal point of the parabolic mirror is approximately at the intersection of CPB 606 and the surface of sample 608. Laser beam 634 enters chamber 602 from the right (after reflecting off mirror 624), and is focused onto the surface of sample 608 by the parabolic mirror. Light emitted from the surface that is incident on the parabolic mirror will be reflected as a parallel beam of light 618 that passes out of chamber 602. Beam of light 618 is partially transmitted through mirror 624 and is detected by detector 632.

One or more processors 650 are connected to various components of the system 600, such as the column 604, laser 630, spectrometer 632, as well as motorized stages, etc. A non-transitory machine-readable storage medium 652 may include executable instructions for the CPB system. These executable instructions, when executed, cause the one or more processors 650 to control various aspects of system operation, such as generation of beam 606, operation of laser 630 and spectrometer 632, etc.

Light Optical Image from Laser Diode

Figure 7:
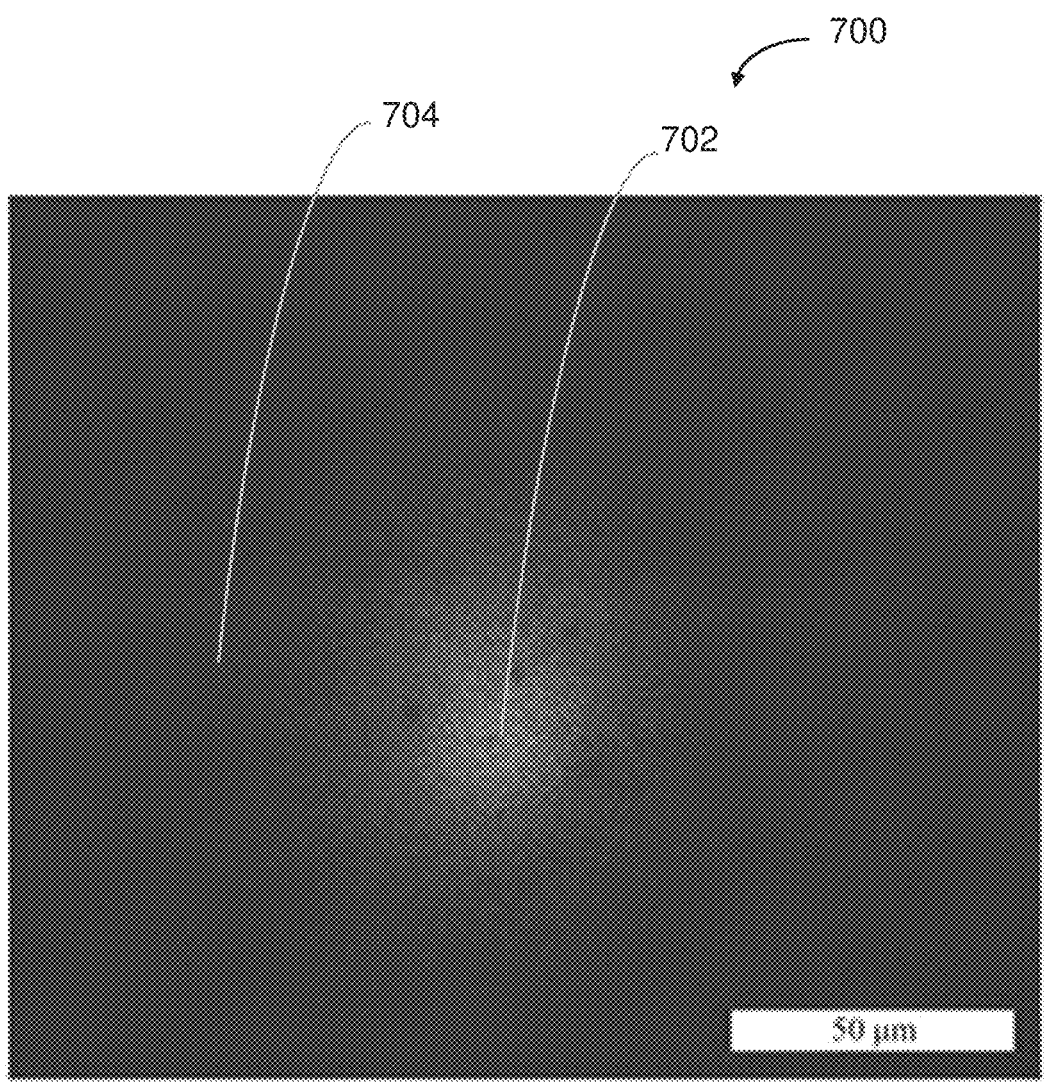
FIG. 7 shows an SEM image formed from cathodoluminescence light emitted from a laser diode surface being scanned with an electron beam while simultaneously illuminated with a laser beam, in accordance with an embodiment.

FIG. 7 shows a light optical image 700 formed from cathodoluminescence light emitted from an LD sample being scanned with an electron beam while simultaneously illuminated with a laser beam, in accordance with an embodiment of the present disclosure. The mechanism to produce image 700 is the following. The power of incident laser beam 618, for example, is tuned to excite the LD just below the lasing threshold, the superlinear output scaling (see FIGS. 9-11) allows the small additional power input from electron beam 606 to produce a brighter optical emission signal from the area receiving combined electron beam and laser beam excitations, which corresponds to the position of the laser beam. Hence, light detector 632 can be used to generate an image of the laser spot, allowing the user to adjust their optical alignments to approximately center the excitation area in the FoV of the SEM. Area 704 is outside the region of the laser beam 618 and is correspondingly darker due to the absence of the superlinear output scaling.

Interaction of Electron and Laser Beams

Figure 8:
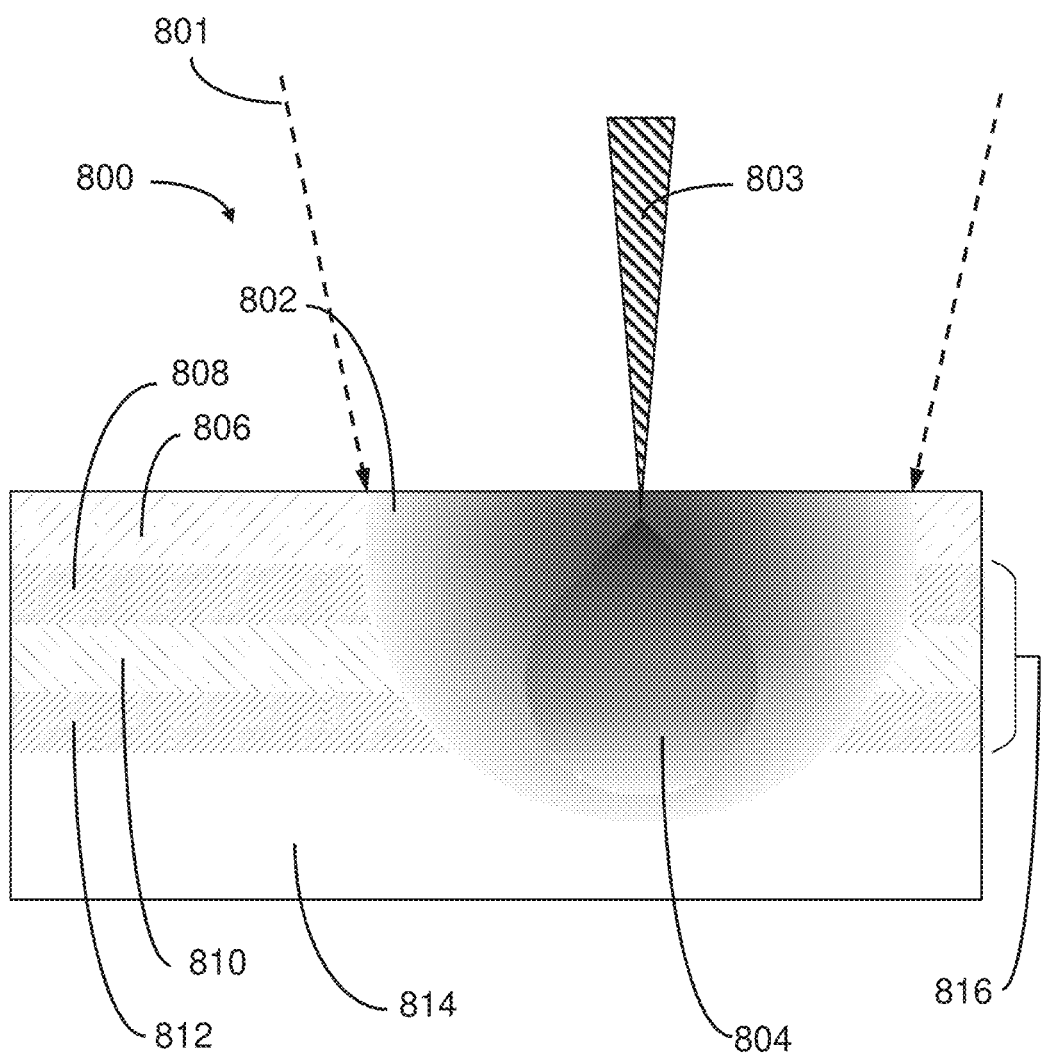
FIG. 8 is an illustration showing interaction of an electron beam and an imaging aid according to an embodiment.

FIG. 8 is an illustration 800 showing an electron beam 803 having excitation volume 804, and a laser beam 801 having an excitation volume 802, both impinging on a quantum well laser. A quantum well laser is an LD in which the active region of the device is so narrow (formed by thin layers of differing materials in a stack) that quantum confinement occurs. An LD may be formed using compound semiconductor materials (e.g., GaAs, AlGaAs, InGaAs, etc.) that (unlike silicon) are able to emit light efficiently. The wavelength of the light emitted by a quantum well LD is determined by the width (thickness) of the active region rather than just the bandgap of the material from which it is constructed. Thus, much longer wavelengths can be obtained from quantum well LDs than from conventional LDs using a particular semiconductor material. The efficiency of a quantum well LD is also greater than a conventional LD due to the stepwise form of its density of states function.

Layer 806 is a surface layer protecting the three layers 808-812 of a quantum well 816 shown. Layers 808 and 812 may comprise GaAs, while center layer 810 may comprise AlGaAs. Other structures of thin layers comprising quantum wells also fall within the scope of the invention, including, but not limited to, a thin layer 810 of InGaAs (the quantum well) embedded between layers 808 and 812 of GaAs. Other quantum wells may comprise a thin layer 810 of GaAs embedded between layers 808 and 812 of AlGaAs. Layers 806-812 are deposited on, and supported by, substrate 814. Note that the electron beam excitation volume 804 is typically much larger than the diameter of the incident electron beam 803. However, the size of the laser excitation volume 802 is typically larger than the electron beam excitation volume 804. In general, the resolution in image 700 will be dominated by the diameter of the electron beam interaction volume 804, and not by the diameter of the laser interaction volume 802.

Superlinear Output Scaling

FIGS. 9-11 show three graphs which illustrate the superlinear output scaling imaging method of an embodiment such as in FIG. 6. The power of incident laser beam 618 is tuned to excite the LD just below the lasing threshold, the superlinear output scaling allows the small additional power input from electron beam 606 to produce a bright optical emission signal from the area receiving combined electron-laser beam excitation, which corresponds to the position of the laser beam. Hence, light detector 632 can be used to generate an image of the laser spot, allowing the user to adjust their optical alignments to accurately localize the excitation area in the FoV of the SEM. Area 704 is outside the region of the laser beam 618 and is correspondingly dark due to the absence of the superlinear output scaling.

FIG. 9 is a graph 900 of the integrated laser diode intensity (in counts/s) 902 plotted against the laser power 904 when the sample is only illuminated by laser beam according to an embodiment such as in FIG. 6. In this example, the LD is illuminated by a 442 nm laser light with laser powers plotted along horizontal axis 904. Note that up to about 400 µW there is no observable light emission from the LD. At the lasing threshold power of around 700 µW (see FIGS. 10 and 11), light emission rapidly rises, corresponding to the beginning of lasing from the LD. Line 908 represents the integrated laser intensity for a laser input power of 700 µW—point 910 is the intersection of lines 906 (700 µW) and 908.

FIG. 10 is a graph 1000 of the integrated laser diode intensity (in counts/s) 1002 plotted against the electron beam current 1004 when the sample is only illuminated by a 5 keV electron beam according to an embodiment such as in FIG. 6. Up to e-beam currents above 25 nA (line 1006), essentially no light emission from the LD is observed. Line 1008 intersects axis 1002 at the light intensity observed for 25 nA e-beam current-point 1010 is the intersection of lines 1006 and 1008 (25 nA beam current), representing the light intensity when the LD is only illuminated by 25 nA of 5 keV electrons (125 µW total beam power, which is not fully absorbed in the LD as can be seen from FIG. 8 where some portions of the electron excitation volume extend outside of the three LD layers 808-812).

FIG. 11 is a graph 1100 of the integrated laser diode intensity (in counts/s) 1102 plotted against the electron beam current 1104 when the sample is simultaneously illuminated by both a 442 nm laser beam (700 µW) and a 5 keV electron beam according to an embodiment such as in FIG. 6. Note that the values on the integrated intensity axis 1102 are 10× higher than for either of graphs 900 or 1000. Thus, the dual excitation of both 442 nm laser light and 5 keV electrons demonstrates superlinear output scaling. Note that the absolute values shown in FIG. 11 for counts/s are a function of the collection efficiency of the particular setup apparatus used optical components of the apparatus used to collect the light.

Flow Diagram of Embodiments

Figure 12:
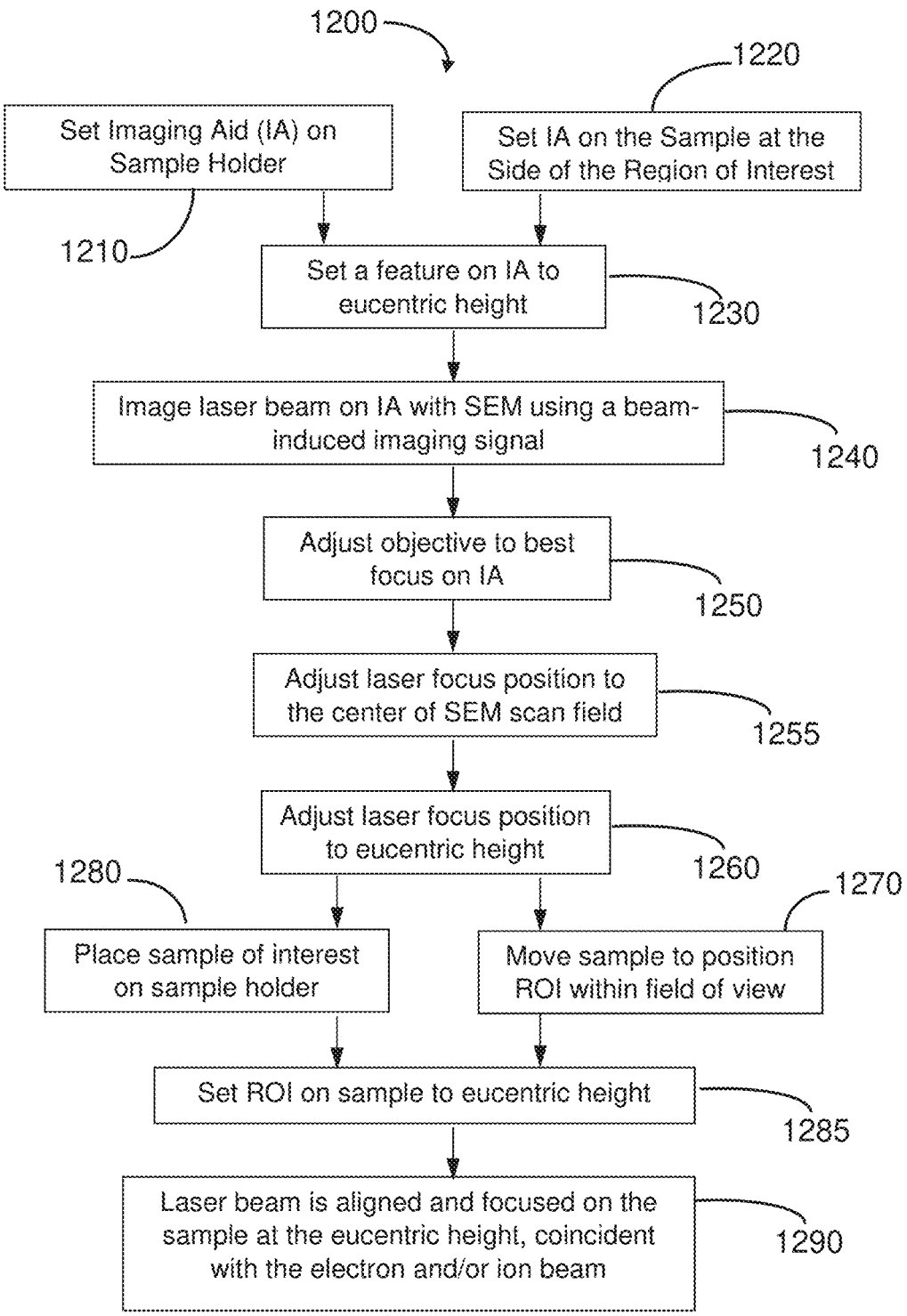
FIG. 12 is a flow diagram of a method for aligning and focusing a light beam in a vacuum chamber of a CPB system according to an embodiment.

FIG. 12 is a flow diagram of method 1200 for aligning and focusing a light beam at a eucentric sample position inside a vacuum chamber of a CPB system according to an embodiment of the present disclosure.

Method 1200 may begin at either block 1210 or block 1220. In block 1210, an IA is attached directly to the sample holder, and the sample of interest is not yet loaded into the sample holder. Examples of IAs include, but are not limited to: a UNCD, an LD, or materials which may retain a charge for a short period of time (such as a few seconds), including but not limited to, alumina or anodized aluminum, magnesium oxide, nickel oxide, and copper oxide. Alternatively, in block 1220, the IA may be deposited on the sample at the side of a region of interest. For both blocks 1210 and 1220, the sample holder may be mounted on a sample stage.

In block 1230 the sample stage is moved vertically to position the IA at the eucentric height.

Next, in block 1240 the IA is imaged using the SEM simultaneously with the laser beam being directed onto the IA. The SEM illuminates the IA with a focused primary electron beam. Due the impact of the primary electron beam, secondary particles such as secondary electrons, backscattered electrons, or photons due to cathodoluminescence or photoluminescence are emitted and collected with a detector, while the primary beam is scanned across the sample in a raster pattern. Due to the interaction between the laser light illuminating the IA and the electron beam scanning across the IA, an image (such as 400 or 700, for example) of the laser beam spot at the IA may be obtained.

In block 1250 the laser optics are adjusted to produce a best focus by adjusting the focal point vertically with respect to the IA. The laser is aligned in the X-Y plane of the sample to ensure alignment of the laser to the CPB. This X-Y alignment procedure ensures that the laser beam goes through the laser optics on-axis, and parallel to the axis, of the laser optics and is focused at the sample at the eucentric height, coincident with the CPB(s). As discussed for FIG. 2, the tilt of the laser beam may be controlled by the construction of the mounting flange for the laser optics, and/or with an additional tilt stage.

In block 1255 the laser optics are adjusted to position the laser focus position at the center of the scan field of the SEM. The laser is aligned in the plane of the IA to ensure alignment of the laser to the CPB.

Alignment continues at block 1260, in which the IA (and the sample of interest if method 1200 started at block 1220), are moved vertically to the eucentric height, and the laser focus is adjusted accordingly by the laser optics to position the laser focus at the eucentric height. The alignment procedure in blocks 1255 and 1260 ensures that the laser beam goes through the laser optics on-axis, and parallel to the axis, of the laser optics and is focused at the sample at the eucentric height, coincident with the CPB(s).

Either block 1270 or block 2180 is now entered after exiting block 1260. Block 1280 is entered out of block 1260 if method 1200 started from block 1210, where only the IA was initially loaded onto the sample holder (i.e., without the sample of interest). Thus, in block 1280, the IA is removed, and the sample of interest is then loaded into the sample holder. Block 1270 is entered out of block 1260 if method 1200 started from block 1220, and both the IA and the sample of interest were loaded initially into the sample holder. Thus, in this case, it is only necessary to use the sample stage 210 to move the region of interest into the FoV of the SEM.

Next, in block 1285 the sample stage is moved vertically to position the sample of interest (with the ROI) to the eucentric height.

Method 1200 is completed at block 1290, in which the laser beam is aligned and focused on the sample of interest at the eucentric height, coincident with the electron beam and/or ion beam from the charged particle column. While method 1200 describes aligning the laser with the electron beam at a eucentric position, method 1200 is not limited to aligning at the eucentric position and eucentric height, nor is the method limited to a focused laser.

Methods 100, 500, and 1200, may be performed using embodiments such as 200, 300 and 600. Other embodiments for performing methods 100, 500 and 1200 also fall within the scope of the invention.

The embodiments above describe using a CPB to make the light beam incidence area on the work piece visible. While the light beam can be made visible for aligning the light beam and the CPB, the light beam can also be rendered visible for other purposes, such as to align the light beam with a feature on the work piece surface. For example, light beam could be used for charge control, sample processing, or photoyield spectroscopy. A suitable light source, which may be, for example, a laser, an LED, or a UV lamp, will vary with the application. While the embodiments above describe adjusting the incidence region of the light beam to coincide with the incidence region of the charged particle beam, one could adjust the position of the incidence region of the charged particle beam to be coincident with the light beam. The following are additional enumerated embodiments according to the present disclosure.

Figure 13:
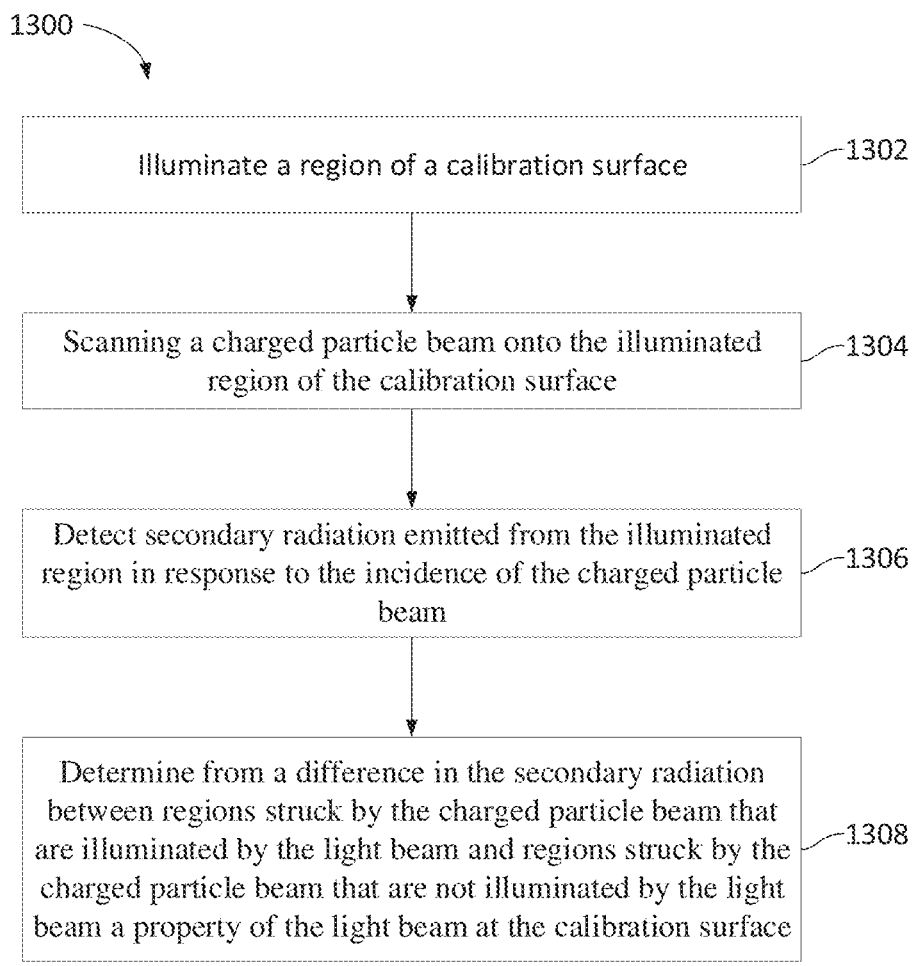
FIG. 13 is a flow diagram of a method of determining a property of a light beam at a surface.

FIG. 13 is a flow diagram of a method 1300 of determining a property of a light beam at a calibration surface. In step 1302, a region of a calibration surface is illuminated with a beam of light. The beam of light may be, for example, a laser beam, a visible light beam, an ultraviolet light beam, or other type of beam from, for example, from a laser source, an LED, or a UV lamp. In step 1304, a charged particle beam is scanned onto a region of the calibration surface illuminated by the beam of light. Preferably, the beam is scanned over a region that includes a portion or all of the region illuminated by the light beam and also includes over a region that is not illuminated by the light beam. The boundary between the illuminated region and the unilluminated region is visible on an image formed using the secondary radiation. That is, one region, typically the illuminated region, will be brighter than the other region in the image, and the line between the bright and darker regions outlines the boundaries of the illumination. The charged particle beam can be, for example, an electron beam or an ion beam.

In step 1306, secondary radiation emitted from the region in response to the incidence of the charged particle beam is collected. The secondary radiation may be, for example, secondary electrons, back scattered electrons, or photons. In step 1308, a property of the light beam at the calibration surface is determined from a difference in the secondary radiation between regions struck by the charged particle beam that are illuminated by the light beam and regions struck by the charged particle beam that are not illuminated by the light beam. The property may be, for example, the position of the beam or the intensity of the beam. The calibration surface functions as an imaging aid, allowing the region of the calibration surface illuminated by the light beam area to be made visible by altering the secondary radiation that is emitted in response to the incident charged particle beam. For example, if the calibration surface comprises UNCD, aluminum oxide, anodized aluminum, magnesium oxide, nickel oxide, or copper oxide, the number of secondary electrons emitted, in response to the incidence of the charged particle beam, from areas illuminated by the light beam and areas not illuminated by the light beam will be different, thereby making visible in a charged particle beam image the area illuminated area. For another example, if the calibration surface includes laser diodes, the intensity of light emitted in response to the charged particle beam from areas illuminated by the light beam and areas not illuminated by the light beam will be different, thereby making visible in a charged particle beam image the illuminated area. If the intensity of illuminating light varies over the illuminated area, the secondary radiation emitted in response to the charged particle beam may vary with the intensity of the illuminating beam, thereby providing a map of the intensity of the luminating light.

By observing the difference in the secondary radiation between different areas of the calibration surface, the position of the light beam on the calibration surface relative to the charged particle beam can be determined. Determining the position of the light beam relative to position of the charged particle beam, allows aligning of the two beams and focusing of the light beam. The beams are typically aligned at a eucentric point. The difference in the secondary radiation between different areas of the calibration surface can also be used to determine when the light beam is in focus, the beams can be aligned and focused at a desired point.

A first embodiment, which is a method of observing a beam of light in a sample chamber of a CPB system, the method comprising providing an IA inside the sample chamber, the IA having a calibration surface configured such that illuminating, with a first beam of light, any area on the calibration surface undergoing irradiation by a second beam of charged particles changes an intensity of secondary radiation that the second beam causes to be emitted from the calibration surface; illuminating a region of the calibration surface with the first beam while the second beam irradiates the region and induces emissions of secondary radiation from the region, wherein the secondary radiation may be light, secondary electrons or backscattered electrons; taking measurements of the intensity of the secondary radiation using a detector; generating an electronic signal based on the measurements that conveys the value of the intensity of the secondary radiation as a function of time; and determining a value of an alignment property of the first beam by analyzing the electronic signal.

A second embodiment, which is the method of the first embodiment, further comprising acquiring a secondary radiation image of the calibration surface by scanning the second beam according to a pattern across the calibration surface, and wherein illuminating the region with the first beam while the second beam irradiates the region comprises irradiating the region with the first beam while the second beam is scanning the region.

A third embodiment, which is the method of the second embodiment, wherein the secondary radiation image of the calibration surface includes an image of a beam spot of the first beam superimposed on the region; and determining the value of the alignment property comprises analyzing the secondary radiation image and the image of the beam spot.

A fourth embodiment, which is the method of the third embodiment, wherein analyzing the secondary radiation image and the image of the beam spot comprises analyzing the secondary radiation image and the image of the beam spot using image recognition software.

A fifth embodiment, which is the method of the third embodiment, wherein an image contrast is a ratio of a signal from the area being illuminated by light to a signal from surrounding areas not illuminated by light.

A sixth embodiment, which is the method of the first embodiment, wherein the value of the alignment property is a first value of an alignment property of the first beam while the beam illuminates the region, further comprising using the first value of the alignment property to calculate a first adjustment to the laser beam system that can change the value of the alignment property of the first beam to a second preselected value; performing the first adjustment; and positioning a sample within the sample chamber such that a sample location selected for subsequent analysis and/or processing by the CPB system is adjacent to the calibration surface.

A seventh embodiment, which is the method of the sixth embodiment, further comprising positioning the calibration surface at a eucentric height of the sample chamber, and wherein the first value of the alignment property comprises a position of a beam spot of the first beam on the calibration surface while the first beam illuminates the region; the second value of the alignment property is the position of the beam spot on the sample positioned at the eucentric height and adjacent to the calibration surface; the preselected value comprises the position of the sample location; and performing the first adjustment moves the first beam such that the beam spot is approximately centered on the sample location.

An eighth embodiment, which is the method of the seventh embodiment, wherein illuminating the region of the calibration surface comprises passing the first beam through a focusing optic, the focusing optic directing and focusing the first beam onto the calibration surface, and further comprising determining a value of the working distance of the focusing optic during illumination of the region by analyzing the electronic signal; using the value of the working distance to calculate a second adjustment of the CPB system, the second adjustment comprising an adjustment of the working distance that will focus the first beam at approximately the eucentric height; and performing the second adjustment.

A ninth embodiment, which is the method of the first embodiment, further comprising providing the IA as a thin layer disposed on a surface of a sample at a location adjacent to a region of interest selected for analysis and/or processing by the CPB system.

A tenth embodiment, which is the method of the first embodiment, wherein the emissions of secondary radiation comprise emissions of secondary electrons and/or backscattered electrons.

An eleventh embodiment, which is the method of the first embodiment, wherein the first beam comprises a laser beam, an LED, or a UV lamp.

A twelfth embodiment, which is the method of the eleventh embodiment, wherein a wavelength of the laser beam is in the range from UV to near-IR.

A thirteenth embodiment, which is the method of the first embodiment, wherein the second beam comprises a focused ion beam.

A fourteenth embodiment, which is the method of the first embodiment, wherein the emissions of secondary radiation comprise emissions of electromagnetic radiation having a wavelength longer than 10 nm.

A fifteenth embodiment, which is the method of the fourteenth embodiment, wherein the emissions of secondary radiation comprise emissions of visible light caused by cathodoluminescence of the region.

A sixteenth embodiment, which is the method of the first embodiment, wherein a lasing threshold power of a material of the IA at the calibration surface is greater than a power of the first beam and a power of the second beam during scanning of the region with the second beam; and less than a sum of the power of the first beam and the power of the second beam.

A seventeenth embodiment, which is the method of the first embodiment, wherein the sample chamber is a vacuum chamber of a scanning electron microscope, and the second beam is an electron beam generated by the scanning electron microscope.

An eighteenth embodiment, which is the method of the seventeenth embodiment, wherein the scanning electron microscope is configured to carry out Raman spectroscopy and the secondary radiation comprises Raman emission of inelastically scattered light.

A nineteenth embodiment, which is a CPB system, comprising a sample chamber; an IA disposed inside the sample chamber and having a calibration surface; a first subsystem configured to generate, and illuminate the calibration surface with, a first beam of light; a second subsystem configured to generate, and irradiate the calibration surface with, a second beam of charged particles; a detector configured to measure the intensity of secondary radiation emitted from the calibration surface and to output an electronic signal that conveys the value of the intensity as a function of time; a computing device configured to determine one or more characteristics of the first beam by analyzing the electronic signal; and wherein the calibration surface is configured such that simultaneously exposing an area of the calibration surface to the first beam and the second beam causes the area to emit the secondary radiation from the area at a first intensity, and exposing the area to the second beam while not exposing the area to the first beam causes the area to emit the secondary radiation at a second intensity different than the first intensity.

A twentieth embodiment, which is the method of the nineteenth embodiment, wherein the second subsystem comprises a focused ion beam column, an electron microscope, or a combination thereof; and the first subsystem comprises a laser beam apparatus and a focusing optic, the laser beam apparatus configured to generate the first beam as a laser beam, and the focusing optic configured to focus and direct the laser beam onto the calibration surface from a position inside the sample chamber.

A twenty-first embodiment, which is the method of the twentieth embodiment, wherein the second subsystem comprises a scanning electron microscope; the sample chamber comprises a vacuum chamber, a wall of the vacuum chamber being equipped with a window port comprising a laser transmissive material that provides a transmission path for transmitting the laser beam through the wall; and the laser beam apparatus is configured generate the laser beam at a position external to the vacuum chamber, and to direct the laser beam into the vacuum chamber via the transmission path.

A twenty-second embodiment, which is the method of the nineteenth embodiment, wherein the second subsystem comprises a scanning electron microscope, the detector comprises a photon detector, and the IA comprises a laser diode, the laser diode comprising a quantum well.

A twenty-third embodiment, which is the method of the nineteenth embodiment, wherein the secondary radiation comprises secondary electrons and the detector comprises an Everhart-Thornley detector.

A twenty-fourth embodiment, which is the method of the twenty-third embodiment, wherein a material of the IA at the calibration surface comprises UNCD.

A twenty-fifth embodiment, which is the method of the twenty-third embodiment, wherein the IA comprises a layer of a first material, disposed on a substrate comprising a second material, and the calibration surface is a surface of the layer.

A twenty-sixth embodiment, which is the method of the twenty-fifth embodiment, wherein the first material comprises an oxide, a chemical composition of the oxide comprising at least one element selected from the group consisting of aluminum, magnesium, nickel and copper.

A twenty-seventh embodiment, which is a non-transitory machine-readable storage medium comprising executable instructions for operating a CPB system, the instructions, when executed, cause one or more processors to direct a subsystem configured to generate and direct a light beam to irradiate the location with a first beam of light during the interval; direct a CPB apparatus to induce emissions of secondary radiation from a location on a calibration surface of an IA disposed within a sample chamber by simultaneously irradiating the calibration surface at the location with a second beam of charged particles for an interval of time; direct a detector to measure the intensity of the secondary radiation during the interval, and to generate a signal that represents the value of the intensity over the interval as a function of time; and direct an analysis of the signal that determines a value of a property that characterizes a state of alignment of the first beam during the interval.

A twenty-eighth embodiment, which is the non-transitory machine-readable storage medium of the twenty-seventh embodiment, wherein the state of alignment is a first state of alignment, and wherein the executable instructions, when executed, cause the one or more processors to calculate an adjustment that will change the first beam from the first state of alignment to a preselected second state of alignment; and direct the subsystem configured to generate and direct a light beam to carry out the calculated adjustment.

A twenty-ninth embodiment, which is the non-transitory machine-readable storage medium of the twenty-eighth embodiment, wherein the property comprises a position of a beam spot of the first beam on the calibration surface, and the adjustment is an adjustment that moves the beam spot to a region of interest on a sample to be analyzed and/or processed by the first beam.

A thirtieth embodiment, which is a method of observing an incident area of a beam of light on the surface of sample in an evacuated chamber using an IA having a calibration surface configured such that illuminating with a CPB a portion of the calibration surface that is also illuminated by the beam of light causes a change in intensity of secondary radiation emitted upon impact of the CPB onto the calibration surface, the method comprising illuminating a region of the calibration surface with the beam of light; scanning the CPB onto the region of the calibration surface illuminated by the beam of light, the CPB having a spot size on the calibration surface smaller than the region illuminated by the beam of light; detecting emissions of secondary radiation emitted from the region in response to the incidence of the CPB as the CPB scans the region; and determining from a difference in the secondary radiation between regions struck by the CPB that are illuminated by the light beam and regions struck by the CPB that are not illuminated by the light beam a property of the light beam at the calibration surface.

A thirty-first embodiment, which is the method of the thirtieth embodiment, in which determining a property of the light beam at the calibration surface comprises determining the position of the light beam at the calibration surface.

A thirty-second embodiment, which is the method of the thirty-first embodiment, in which the scanning the CPB includes positioning the CPB at points on the calibration surface using a CPB reference frame and in which determining the position of the light beam on the calibration surface comprises determining the position of the light beam in the CPB frame of reference.

A thirty-third embodiment, which is the method of the thirty-first embodiment, further comprising adjusting the position of the region illuminated with the beam of light.

A thirty-fourth embodiment, which is the method of the thirtieth embodiment, in which determining a property of the light beam at the calibration surface comprises determining the shape of the light beam at the calibration surface.

A thirty-fifth embodiment, which is the method of the thirtieth embodiment, further comprising removing the IA from the path of the beam of light and placing a work piece in the path of the beam of light; and processing or imaging the work piece using the beam of light and using the CPB.

Although the present invention and its advantages have been described in detail, it should be understood that various changes, substitutions and alterations can be made to the embodiments described herein without departing from the scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Many variations and modifications of the invention disclosed herein are possible, and alternative embodiments that result from combining, integrating, and/or omitting features of the embodiments disclosed herein are also within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl and an upper limit, Ru, is disclosed, any number falling within the range is specifically disclosed. In particular, the following numbers within the range are specifically disclosed: R=Rl+k*(Ru−Rl), wherein k is a variable ranging from 1 percent to 100 percent with a 1 percent increment, i.e., k is 1 percent, 2 percent, 3 percent, 4 percent, 5 percent, 50 percent, 51 percent, 52 percent, 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim is intended to mean that the subject element is required, or alternatively, is not required. Both alternatives are intended to be within the scope of the claim. Use of the term "may" to introduce features of embodiments of the disclosure (e.g., "In an embodiment, the widget may be connected to a cog,") is intended to mean that embodiments reciting said features are considered to be within the scope of the invention and such embodiments shall be construed as being positively recited by the specification. However, use of the term "may" to introduce features of embodiments is not an indication that embodiments failing to recite said features are considered outside the scope of the invention. Further, although various features of embodiments are described in plural form (e.g., attachment surfaces, localized attractive sites, etc.), embodiments having single instances of said features (e.g., one attachment surface, one localized attractive site, etc.), alone or in combination with single or plural instances of other features, are also contemplated to be within the scope of the invention unless explicitly indicated otherwise. Use of broader terms such as "comprises," "includes," "having," etc. should be understood to provide support for narrower terms such as "consisting of," "consisting essentially of," "comprised substantially of," etc.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the embodiments of the present invention. The discussion of a reference in the Detailed Description of the Embodiments is not an admission that it is prior art to the present invention, especially any reference that may have a publication date after the priority date of this application.

We claim as follows:

1. A method comprising:
   illuminating a region of a calibration surface with a beam of light;
   scanning a charged particle beam onto the region of the calibration surface illuminated by the beam of light;
   detecting secondary radiation emitted from the region in response to the incidence of the charged particle beam; and
   determining from a difference in the secondary radiation between regions struck by the charged particle beam that are illuminated by the light beam and regions struck by the charged particle beam that are not illuminated by the light beam a property of the light beam at the calibration surface.

2. The method of claim 1 in which the calibration surface comprises nano-crystalline diamond.

3. The method of claim 1 in which determining a property of the light beam at the calibration surface comprises determining the position of the light beam at the calibration surface.

4. The method of claim 3 in which scanning the charged particle beam includes positioning the charged particle beam at points on the calibration surface using a charged particle beam reference frame and in which determining the position of the light beam on the calibration surface comprises determining the position of the light beam in the charged particle beam frame of reference.

5. The method of claim 3 further comprising adjusting the position of the region illuminated with the beam of light.

6. The method of claim 1 in which determining a property of the light beam at the calibration surface comprises determining the shape of the light beam at the calibration surface.

7. The method of claim 1 further comprising:
   removing an imaging aid from the path of the beam of light, the imaging aid including the calibration surface, and placing a work piece in the path of the beam of light; and
   processing or imaging the work piece using the beam of light and using the charged particle beam.

8. A method of observing a beam of light in a sample chamber of a charged particle beam system, the method comprising:

providing an imaging aid inside the sample chamber, the imaging aid having a calibration surface configured such that illuminating, with a first beam of light, any area on the calibration surface undergoing irradiation by a second beam of charged particles changes an intensity of secondary radiation that the second beam causes to be emitted from the calibration surface;

illuminating a region of the calibration surface with the first beam while the second beam irradiates the region and induces emissions of secondary radiation from the region, wherein the secondary radiation may be light, secondary electrons or backscattered electrons;

detecting the secondary radiation;

generating an electronic signal corresponding to the intensity of the secondary radiation as a function of time; and determining a value of an alignment property of the first beam by analyzing the electronic signal.

9. The method of claim 8, further comprising acquiring a secondary radiation image of the calibration surface by scanning the second beam according to a pattern across the calibration surface, and wherein illuminating the region with the first beam while the second beam irradiates the region comprises irradiating the region with the first beam while the second beam is scanning the region.

10. The method of claim 9, wherein:
the secondary radiation image of the calibration surface includes an image of a beam spot of the first beam superimposed on the region; and
determining the value of the alignment property comprises analyzing the secondary radiation image and the image of the beam spot.

11. The method of claim 8, wherein the value of the alignment property is a first value of an alignment property of the first beam of light while the beam illuminates the region and wherein the first beam of light is a laser beam generated by a laser beam system, further comprising:
using the first value of the alignment property to calculate a first adjustment to the laser beam system that can change the value of the alignment property of the first beam to a second preselected value;
performing the first adjustment; and
positioning a sample within the sample chamber such that a sample location selected for subsequent analysis and/or processing by the charged particle beam system is adjacent to the calibration surface.

12. The method of claim 11, further comprising positioning the calibration surface at a eucentric height of the sample chamber, and wherein:
the first value of the alignment property comprises a position of a beam spot of the first beam on the calibration surface while the first beam illuminates the region;
the second value of the alignment property is the position of the beam spot on the sample positioned at the eucentric height and adjacent to the calibration surface;
the preselected value comprises the position of the sample location; and
performing the first adjustment moves the first beam such that the beam spot is approximately centered on the sample location.

13. The method of claim 12, wherein illuminating the region of the calibration surface comprises passing the first beam through a focusing optic, the focusing optic directing and focusing the first beam onto the calibration surface, and further comprising:

determining a value of the working distance of the focusing optic during illumination of the region by analyzing the electronic signal;
using the value of the working distance to calculate a second adjustment of the charged particle beam system, the second adjustment comprising an adjustment of the working distance that will focus the first beam at approximately the eucentric height; and
performing the second adjustment.

14. The method of claim 8, in which providing the imaging aid comprises providing the imaging aid as a thin layer disposed on a surface of a sample at a location adjacent to a region of interest selected for analysis and/or processing by the charged particle beam system.

15. The method of claim 8, wherein the first beam comprises a laser beam and the emissions of secondary radiation comprise emissions of secondary electrons, backscattered electrons and/or emissions of visible light caused by cathodoluminescence of the region.

16. The method of claim 8, wherein a lasing threshold power of a material of the imaging aid at the calibration surface is:
greater than a power of the first beam and a power of the second beam during scanning of the region with the second beam; and
less than a sum of the power of the first beam and the power of the second beam.

17. A charged particle beam system, comprising:
a sample chamber;
an imaging aid disposed inside the sample chamber and having a calibration surface;
a first subsystem configured to generate, and illuminate the calibration surface with, a beam of light;
a second subsystem configured to generate, and irradiate the calibration surface with, a beam of charged particles;
a detector configured to measure the intensity of secondary radiation emitted from the calibration surface and to output an electronic signal that conveys the value of the intensity as a function of time; and
a computing device configured to determine one or more characteristics of the first beam by analyzing the electronic signal,
wherein, based on simultaneously exposing an area of the calibration surface to the first beam of light and the beam of charged particles, causes the exposed area to emit the secondary radiation from the exposed area at a first intensity, and
wherein, based on exposing the area to the beam of charged particle while not exposing the area to the beam of light causes the exposed area to emit the secondary radiation at a second intensity different than the first intensity.

18. The system of claim 17, wherein:
the second subsystem comprises a focused ion beam column, an electron microscope, or a combination thereof; and
the first subsystem comprises a laser beam apparatus and a focusing optic, the laser beam apparatus configured to generate the first beam as a laser beam, and the focusing optic configured to focus and direct the laser beam onto the calibration surface from a position inside the sample chamber.

19. The system of claim 17 wherein the imaging aid at the calibration surface comprises ultra-nano-crystalline diamond.

20. The system of claim 17, wherein the imaging aid comprises a layer of a first material, disposed on a substrate comprising a second material, and the calibration surface is a surface of the layer.

\* \* \* \* \*